United States Patent [19]

Silvestri et al.

[11] Patent Number: 4,526,631

[45] Date of Patent: Jul. 2, 1985

[54] METHOD FOR FORMING A VOID FREE ISOLATION PATTERN UTILIZING ETCH AND REFILL TECHNIQUES

[75] Inventors: Victor Silvestri, Hopewell Junction; D. Duan-Lee Tang, Pleasantville, both of N.Y.

[73] Assignee: International Business Machines Corporation, Armonk, N.Y.

[21] Appl. No.: 624,320

[22] Filed: Jun. 25, 1984

[51] Int. Cl.$^3$ .................... H01L 21/302; H01L 21/76
[52] U.S. Cl. ................................ 148/175; 29/576 E; 29/576 W; 29/578; 29/580; 148/174; 148/DIG. 26; 148/DIG. 50; 148/DIG. 85; 156/643; 156/644; 156/648; 156/653; 357/49; 357/50
[58] Field of Search ............. 148/174, 175; 29/576 E, 29/576 W, 578, 580; 156/643, 644, 648, 653; 357/49, 50

[56] References Cited

U.S. PATENT DOCUMENTS

| | | | |
|---|---|---|---|
| 3,661,636 | 5/1972 | Green et al. ..................... | 148/175 X |
| 3,934,060 | 1/1976 | Burt et al. ............................. | 427/95 |
| 3,969,168 | 7/1976 | Kuhn ........................... | 29/576 W X |
| 4,104,086 | 8/1978 | Bondur et al. ........................ | 148/1.5 |
| 4,255,207 | 3/1981 | Nicolay et al. ..................... | 148/174 |
| 4,256,514 | 3/1981 | Pogge .................................... | 148/1.5 |
| 4,309,716 | 1/1982 | El-Kareh ..................... | 29/576 W X |
| 4,454,646 | 6/1984 | Joy et al. ........................ | 29/576 W |
| 4,473,598 | 9/1984 | Ephrath et al. ............. | 29/576 W X |

FOREIGN PATENT DOCUMENTS

| | | | |
|---|---|---|---|
| 58-51533 | 3/1983 | Japan ................................ | 29/576 W |
| 58-192346 | 11/1983 | Japan ................................ | 29/576 W |

OTHER PUBLICATIONS

French, W. B., "Technique for Reducing Surface Leakage . . . ", R.C.A. Tech. Notes, No. 919, Oct. 25, 1972, 2 Pages.

Druminski et al., "Selective Etching and Epitaxial Refilling . . . ", J. Crystal Growth, 31 (1975), pp. 312-316.

Runyan et al., "Behavior of Large-Scale Surface Perturbations . . . ", J. Electro Chem. Soc., vol. 114, No. 11, Nov. 1967, pp. 1154-1158.

L. M. Ephrath et al., Patent Application, Ser. No. 393,997 filed Jun. 30, 1982, (YO 9-81-069).

J. M. Harvilchuck et al., Patent Application, Ser. No. 822,775, filed Aug. 8, 1975, now abandoned.

N. Endo et al., "Novel Device Isolation Technology with Selective Epitaxial Growth", IEDM Tech. Digest p. 241, San Francisco meeting Dec. 13-15, 1982.

W. A. Claassen et al., "The Nucleation of CVD Silicon on SiO$_2$ and Si$_3$N$_4$ Substrates", J. Electrochem. Soc.: Solid-State Science and Technology, vol. 128, No. 6, pp. 1353-1359.

Hans Kurten et al., "Selective Low-Pressure Silicon Epitaxy for MOS and Bipolar Transistor Application", in IEEE Transactions on Electron Devices, vol. Ed-30, No. 11, Nov. 1983, pp. 1511-1515.

H. J. Voss, et al., "Device Isolation Technology by Selective Low-Pressure Silicon Epitaxy", IEDM Dec. 1983, paper 2.5, pp. 35-38.

P. Rai-Choudhury et al., "Selective Silicon Epitaxy & Orientation Dependence of Growth", IEEE Transactions of Electron Devices, J. Electrochem. Soc. Solid State Science & Technology, May 1973, pp. 664-668.

N. Endo et al., "Novel Device Isolation Technology with Selective Epitaxial Growth", IEDM 1982, Paper No. 9.7, pp. 241-244.

K. Tanno et al., "Selective Silicon Epitaxy Using Reduced Pressure Technique", Japanese Journal of Applied Physics, vol. 21, No. 9, Sep. 1982, pp. L564-L566.

*Primary Examiner*—William G. Saba
*Attorney, Agent, or Firm*—George O. Saile

[57] ABSTRACT

The void-free pattern of isolation in a semiconductor substrate is described. There is contained within a semiconductor body a pattern of substantially vertically sided trenches. The pattern of isolation trenches isolate regions of monocrystalline semiconductor material which may contain active and passive semiconductor devices. The depth of the pattern of trenches is greater than about 3 micrometers. A first insulating layer is located upon the sidewalls of the trenches. The base or bottom of the trenches is open to the monocrystalline semiconductor body. An epitaxial layer extending from the base of the trenches fills the pattern of trenches up to between about 500 to 1500 nanometers from the upper surface of the trenches. A capping second insulating layer fills the additional portion of the pattern of trenches above the upper surfaces of the epitaxial layer for isolation of the pattern of trenches from the ambient. It is the dense epitaxial monocrystalline semiconductor which prevents the formation of voids within the pattern of trenches. The epitaxial layer must be grown in such a way so as no spurious growth occurs upon the principal surfaces of the substrate, because such growth would prevent the satisfactory chemical-mechanical polishing of the C.V.D. insulator layer.

10 Claims, 5 Drawing Figures

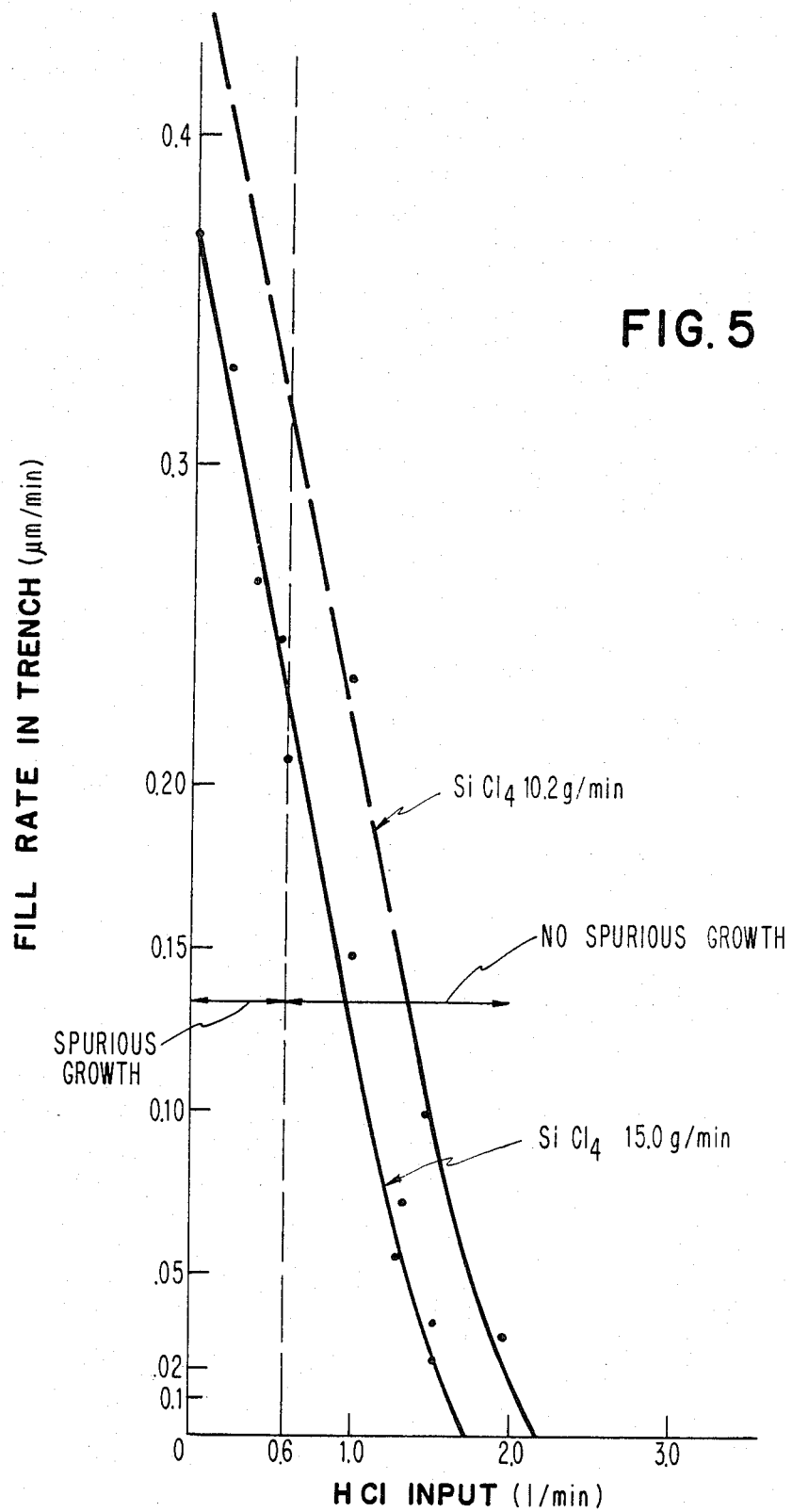

METHOD FOR FORMING A VOID FREE ISOLATION PATTERN UTILIZING ETCH AND REFILL TECHNIQUES

DESCRIPTION

1. Field of Invention

The present invention is concerned with methods for filling trenches in semiconductor substrates so as to form void free patterns of isolation within the substrate. In particular, the process and resulting structure is involved in forming a pattern of isolation in a semiconductor substrate wherein the isolation includes epitaxial semiconductor material and a low temperature, chemical vapor deposited insulator thereover.

2. Cross Reference to Related Application

Patent application Ser. No. 624,425 filed 6/25/84, entitled "Method and Resulting Structure for Forming a Void Free Isolation Structure", by K. D. Beyer et al (FI 9-83-082).

3. Description of the Prior Art

In the monolithic integrated circuit technology, it is usually necessary to isolate various active and passive elements from one another within the integrated circuit structure. These devices have been isolated by back biasing PN junctions, partial dielectric isolation and complete dielectric isolation. The dielectric materials used have been silicon dioxide and the like. The preferred isolation for these active and passive devices is some form of dielectric isolation. The dielectric isolation has the substantial advantage over PN junction isolation because it allows the butting of circuit elements against the isolation and thereby result in greater density of packing of the active and passive devices in the integrated circuitry.

A form of dielectric isolation is disclosed in the H. B. Pogge U.S. Pat. No. 4,256,514. Pogge describes isolation refill techniques employed in deep trench isolation formation wherein chemical vapor deposition or the like is used to deposit insulating material such as, silicon dioxide or polycrystalline silicon into the pattern of trenches. Such systems involve a homogeneous gas phase reaction wherein the silicon dioxide, polycrystalline silicon or the like is formed in the gas from the reactive species present and is deposited therefrom onto the surfaces and into the pattern of trenches. The problem with this method of deposition is that there is a tendency to form voids within the trench patterns particularly where trenches cross one another. Also, the refilling deposition can produce structurally deficient or loosely packed material which may not be the best isolation structures in integrated circuits. The presence of voids and this loose structure have a tendency to magnify the formation of defects in silicon areas which are later to serve as active or passive device regions.

The L. M. Ephrath et al., Patent Application Ser. No. 393,997 filed 6/30/82, now U.S. Pat. No. 4,473,598 assigned to the same assignee as the present invention describes another dielectric isolation method and resulting structure wherein the pattern of trenches is filled with void-free polycrystalline silicon or epitaxial silicon. Ephrath et al., utilize a sidewall composed of insulating material with or without a nucleating material thereover. The bottom of the trench pattern is open to the monocrystalline semiconductor body such as silicon. Epitaxial silicon is then grown from the bottom opening of the monocrystalline silicon body and perpendicular from the sidewall surfaces containing the nucleating material. While the result of this epitaxial growth is a void free-structure, there are sharp facets near the top of the insulating sidewall, where no nucleating material is used. The epitaxial layer filling grows from the substrate. The epitaxial layer and substrate is typically monocrystalline silicon. This is also illustrated in N. Endo et al., "Novel Device Isolation Technology with Selective Epitaxial Growth" IEDM Tech. Digest p. 241, San Francisco Meeting Dec. 13-15, 1982. Where a nucleating layer of, for example, polycrystalline silicon is used over the insulating sidewall only a small epitaxial layer filling and mostly polycrystalline semiconductor layer results. A void is usually formed in the structure in deeper structures (about 4 $\mu$m) required for isolation than those employed by N. Endo et al.

Selective epitaxial growth on monocrystalline silicon areas has been accomplished by workers in the field with reduced polycrystalline silicon growth on masking insulator layers on the surface of the monocrystalline silicon substrate. W. A. P. Claassen et al., in "The Nucleation of CVD Silicon on $SiO_2$ and $Si_3N_4$ Substrates" J. Electrochem. Soc.: Solid-State Science and Technology, Vol. 128, No. 6, pp. 1353-1359 describes in a theoretical way epitaxial growth of silicon using a $SiH_4$-$HCl$-$H_2$ system. Hans Kürten et al., in "Selective Low-Pressure Silicon Epitaxy for MOS and Bipolar Transistor Application" in IEEE Transactions on Electron Devices, Vol. ED-30, No. 11, November 1983, pp. 1511-1515 and H. J. Voss, et al., in "Device Isolation Technology By Selective Low-Pressure Silicon Epitaxy" IEDM December 1983, paper 2.5 pp. 35-38 teaches that it is impossible to obtain flat surfaces at atmospheric pressure and deposition conditions when using a $SiH_2Cl_2$-$HCl$-$H_2$ system. The papers further indicates that operation of the system lower then 1060° C. at 760 torr or 1 atmosphere deposition cannot produce satisfactory results. The papers show experimentally that one must operate at low pressures, of the order of 40 torr and temperatures of the order of 950° C. using a $SiH_2Cl_2$ system. The IEEE Transactions on Electron Devices article references the P. Rai-Choudhury et al., article in J. Electrochem. Soc. Solid State Science and Technology, May 1973, pp. 664-668 is cited by Kürten et al to show that very significant and undesirable faceting is produced at atmospheric deposition conditions. Kürten et al., teaches that the low pressure and lower temperature conditions are required to overcome these undesirable conditions. In N. Endo et al., in "CMOS Technology Using SEG Isolation Technique" in IEDM 1983, paper number 2.4, pp. 31-34; and N. Endo et al., in "Novel Device Isolation Technology with Selective Epitaxial Growth" in IEDM 1982, paper number 9.7, pp. 241-244; and K. Tanno et al., in "Selective Silicon Epitaxy Using Reduced Pressure Technique" in Japanese Journal of Applied Physics, Vol. 21, No. 9, September 1982, pp. L564-L566 describe low pressure epitaxial deposition similar to the above cited Kürten et al., papers. They also use the $SiH_2Cl_2$-$HCl$-$H_2$ system. These papers utilize polysilicon on the sidewall of patterned silicon dioxide layer to obtain flat surfaces as seen in the N. Endo et al., IEDM 1982, pp. 243 FIG. 3A and 3B.

It is an object of this invention to provide a method for forming void-free, deep isolation structures in monocrystalline semiconductor bodies wherein substantially vertical sided trenches are filled with a insulating layer sidewall and an epitaxially grown monocrystalline silicon structure and capped with a chemically vapor deposited insulating layer which is then planarized using a chemical-mechanical polishing process. The key problem to be overcome in this process is the spurious growth of polycrystalline silicon on the surface insulating layer during epitaxial silicon growth with the pattern of trenches.

SUMMARY OF THE PRESENT INVENTION

The void-free pattern of isolation in a semiconductor substrate is described. There is contained within a semiconductor body a pattern of substantially vertically sided trenches. The pattern of isolation trenches isolate regions of monocrystalline semiconductor material which may contain active and passive semiconductor devices. The depth of the pattern of trenches is greater than about 3 micrometers. A first insulating layer is located upon the sidewalls of the trenches. The base or bottom of the trenches is open to the monocrystalline semiconductor body. An epitaxial layer extending from the base of the trenches fills the pattern of trenches up to between about 0.5 micrometers to 1.5 micrometers from the upper surface of the trenches. A capping second insulating layer fills the additional portion of the pattern of trenches above the upper surfaces of the epitaxial layer for isolation of the pattern of trenches from the ambient. It is the dense epitaxial monocrystalline semiconductor which prevents the formation of voids within the pattern of trenches. The epitaxial layer must be grown in such a way so as no spurious growth occurs upon the principal surfaces of the substrate, because such growth would prevent the satisfactory chemical-mechanical polishing of the C.V.D. insulator layer.

The methods for forming void-free, deep isolation patterned structure in a semiconductor body such as, monocrystalline silicon proceeds by first forming substantially vertically sided pattern of trenches having an insulating layer sidewall and open bottom to the monocrystalline silicon body. The depth of the pattern of trenches is greater than about 3 micrometers. Monocrystalline silicon is epitaxially grown in the trenches from the monocrystalline silicon bottom to form a dense void-free trench structure up to about 0.5 micrometers to 1.5 micrometers from the top of the trench structure. A $SiCl_4$-$H_2$-HCl gaseous reaction system is used at a pressure of about 1 atmosphere and temperature between about 900° to 1100° C. These process conditions prevents the formation of spurious polycrystalline silicon growth upon surface insulating layers while accomplishing the filling of the deep pattern of isolation trenches in a rapid manner. A insulating capping layer of such as, silicon dioxide is utilized to isolate the pattern of trenches from the ambient. This is accomplished by the chemical vapor deposition (CVD) of the insulating layer and the chemical-mechanical polishing is employed for removal of the insulating layer above the top surface of the pattern of trenches.

BRIEF DESCRIPTION OF THE DRAWINGS

FIG. 5 is a graphical representation showing the relationship of fill rate vs. HCl input for two $SiCl_4$ inputs.

DETAILED DESCRIPTION OF THE PREFERRED EMBODIMENTS

Figure 1:
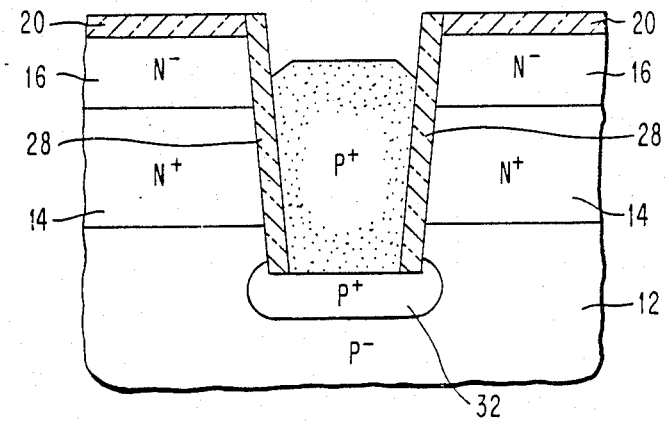
FIGS. 1 through 3 illustrate the process of the present invention for forming a void-free isolation structure in a monocrystalline semiconductor body.

Referring now more particularly to FIG. 1, there is shown a semiconductor body 12 of a P— conductivity type. The semiconductor body is typically <100> crystallographically oriented silicon and of a resistivity in the order of 1 to 20 ohm-cm. Conventional lithography and etching techniques are utilized to form the mask for the subcollector diffusion step. N type impurities are then diffused by conventional techniques to form a region having a surface concentration level of typically $5 \times 10^{20}$ atoms/cc. The N type impurity may be, for example, arsenic or antimony. The structure is now subjected to a thermal oxidation to form silicon dioxide thereover. Simultaneously with the growth of the silicon dioxide, the N type impurity is driven further into the semiconductor body. If it were desired to form a PNP transisor rather than an NPN transistor, opposite conductivity types are utilized as is well understood by those skilled in the art.

The silicon dioxide layer on the surface of the silicon body is removed by use of conventional etching techniques. The silicon body is then placed in an epitaxial growth chamber and a monocrystalline silicon layer is grown upon the principal surface of the silicon body having the N+ diffusions therein. This growth is done by conventional techniques such as the use of $SiCl_4/H_2$; $SiH_2Cl_2/H_2$ or $SiH_4/H_2$ mixtures at growth temperatures of about 1000° C. to 1200° C. The thickness of the epitaxial layer is typically 1.5 micrometers but may be in the range of 0.5 to 5 micrometers. During the epitaxial growth the epitaxial layer is doped with an N— type impurity of a low concentration level which is typically $2 \times 10^{16}$ atoms/cc. During the epitaxial growth, the N+ region outdiffuses into the epitaxial layer to fully form the final N+ region 14 as illustrated in FIG. 1. The remaining portions of the epitaxial layer 16 will be N— doped. The region 14 will be connected as the subcollector of the NPN transistor as is understood by those skilled in the art.

An insulating layer 20 is formed upon the principal surface of the substrate. It may be a composite of several layers. For example a silicon dioxide layer may be formed by conventional techniques of either thermal growth at a temperature of about 970° C. in wet or dry oxygen ambient or by chemical vapor deposition. A silicon nitride layer may be formed thereover typically by a chemical vapor deposition. A second silicon dioxide layer may be formed by chemical vapor deposition over the silicon nitride layer. A resist layer (not shown) is deposited over the insulating layer.

This insulating layer is then formed into a mask using conventional lithography techniques so that openings are provided in the desired pattern of isolation trenches planned. The layer 20 is etched using conventional chemical, reactive ion etching or plasma etching techniques at the openings of resist layer down to the monocrystalline silicon substrate.

The substrate is now ready to utilize the layer 20 as the mask for the trench formation following the removal of the resist layer from the surface of layer 20. This process must be accomplished using anisotropic reactive ion etching (RIE) which produces substantially vertical sidewalls for the trenches. The trench depth for bipolar device isolation is at least 3 micrometers and preferably 4.0 to 7.0 micrometers. One suitable example of forming the trenches by RIE is the use of carbontetrafluoride ($CF_4$) gas. Other suitable examples of gases include $CCl_4$-Ar and $Cl_2$-Ar. Details of the RIE are described in the co-pending patent application of J. M. Harvilchuck et al., Ser. No. 960,322, filed Nov. 13, 1978, which is a continuation of patent application Ser. No. 822,775, filed Aug. 8, 1975, now abandoned and the J. A. Bondur et al., U.S. Pat. No. 4,104,086 and assigned to the same assignee as the assignee of this invention.

An insulator layer 28 of, for example, silicon dioxide is preferably formed by thermal oxidation in steam at a temperature of about 970° C. on the surface of the trenches. The layer 28 of silicon dioxide may alternatively be formed by chemical vapor deposition but this would necessitate the removal of the deposited silicon dioxide from the layer 20 surface. The preferred thickness of the layer 28 of the silicon dioxide is preferably in the range of 50 to 500 nanometers. It may be also desirable to form a composite layer of silicon dioxide and silicon nitride layer as insulating layer 28 on the surface of the substrate. This silicon nitride layer can be deposited by conventional chemical vapor deposition techniques. An additional $SiO_2$ layer may be then deposited by CVD techniques, such as TEOS.

The layer 28 is removed from the base of the trench pattern by anisotropic etch such as reactive ion etching.

Next, monocrystalline semiconductor material, typically silicon is epitaxially grown in the pattern of trenches from the monocrystalline semiconductor bottom of the trench. The method of growing silicon is by a gas-solid or heterogeneous reaction system. The heterogeneous reaction system desirably includes hydrogen, silicon and chlorine. The particularly preferred system is a combination of gases including $SiCl_4$, $H_2$, HCl and the P+ dopant $B_2H_6$. The epitaxial growth trench filling process is carried out at temperature of between about 900° C. to 1100° C. and preferably about 1000° C. to provide a sufficiently fast filling of the trenches. This is highly preferable when a bipolar pattern of trench isolation is being formed, because of the substantial depth of the trenches. The dopant concentration of $B_2H_6$ or the like is between about $1 \times 10^{19}$ a/cc to $3 \times 10^{20}$ a/cc to provide a epitaxial filling material having a resistivity of about 0.01 to 0.005 ohm-cm. Subsequent heating of this structure produces a P+ region 32 in the substrate to form one portion of the isolation structure. The P+ dopant is used where NPN transistors are to be formed. Where PNP devices are to be formed, opposite conductivities are used as is understood by one skilled in the art. The epitaxial layer extends from the base of the pattern of trenches up to between about 0.5 to 1.5 micrometers from the upper top surface of the pattern of trenches. The resulting structure is shown in FIG. 1.

Figure 4:
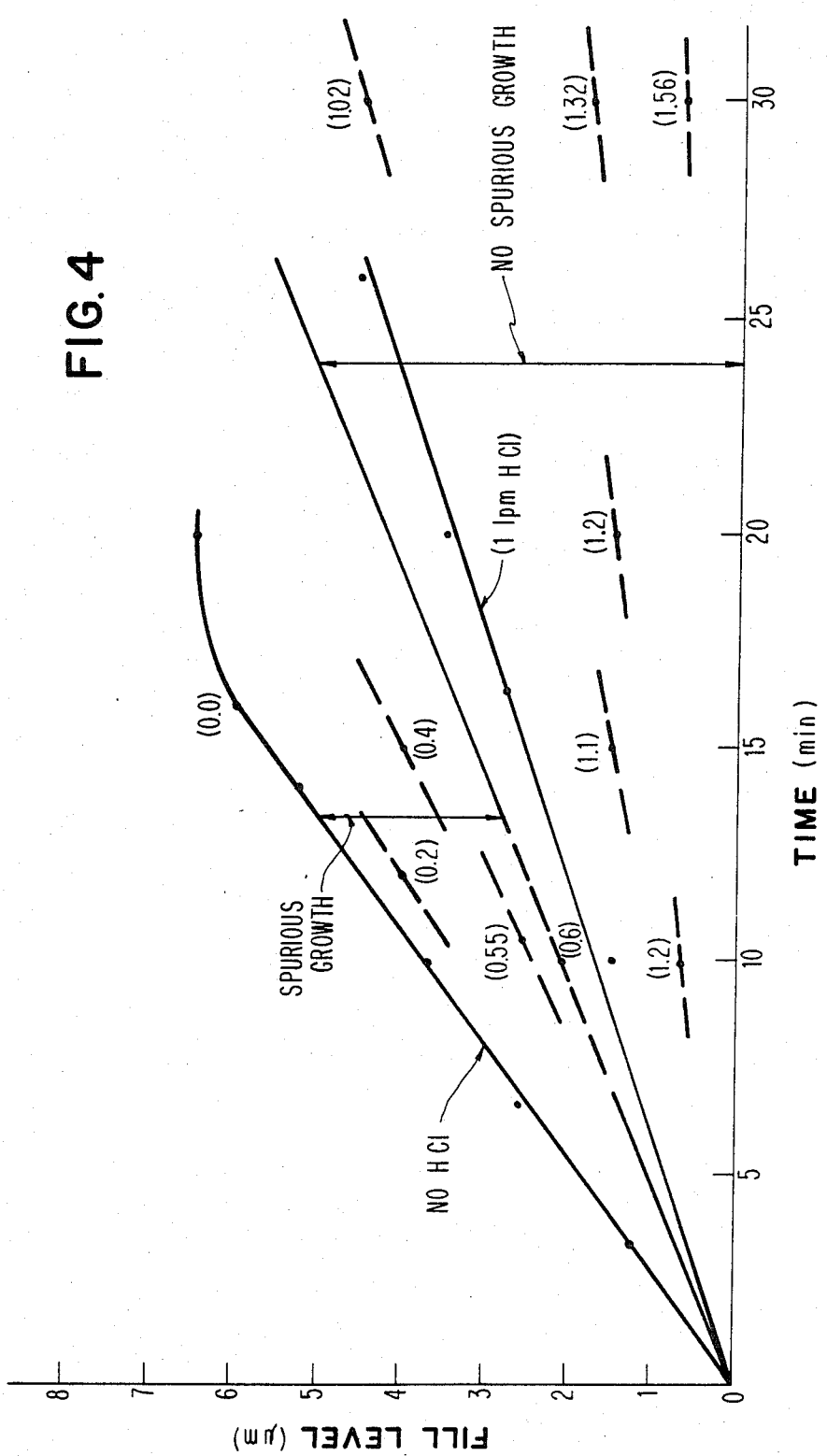
FIG. 4 is a graphical representation showing the relationship of fill level versus time where HCl is used in the $SiCl_4$-$H_2$ system and where HCl is not used.

FIG. 4 shows the preferred deposition regime for depositing the epitaxial refill in the trench structures. The arrow with the spurious growth label indicates region in the drawing representing conditions in which spurious growth was observed and is an undesirable region to operate in. The samples examined in this regime were deposited at the HCl lpm flows indicated next to the data. No spurious growth was observed on samples grown at the 0.6 lpm and higher. This region of no spurious growth is indicated on both FIG. 4 and FIG. 5 and includes HCl inputs above 0.6 lpm. Since deposition rates decrease with HCl input as seen in FIG. 5, for filling deep trenches the preferred rate is between 0.05 to 0.3 micrometers/minute and optimally at 0.1 micrometers/minute as also shown in FIG. 5. The higher rate can be obtained by increasing the $SiCl_4$ input as shown in FIG. 5. Suitable precleaning of the trenches prior to the epitaxial refill can include a post RIE cleaning followed by an $O_2$ ash for 30 minutes. A Buffered HF exposure can be used to remove any silicon oxide which might form at room temperature.

The trench widths on the same integrated circuit substrate may be of various widths in the range of, for example, 1 to 300 micrometers. Experiments have shown that the re-filling level of epitaxial silicon does not vary significantly for trench widths in this range with a experimental maximum nominal deviation found to be about ±10%. Re-fills using this system contains no voids and exhibited top growth surfaces indicative of highly-oriented single crystal growth.

Figure 2:
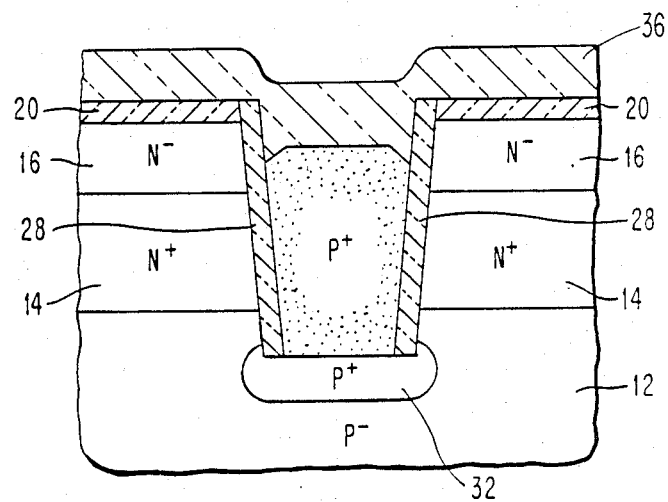
Figure 3:
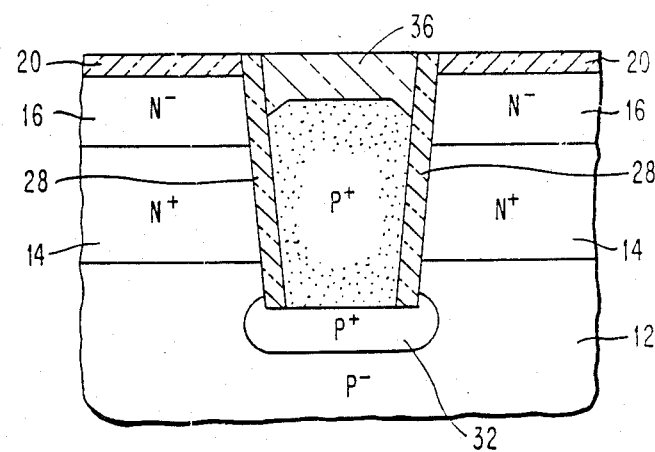

A low temperature insulator deposition forms the conformal layer 36 as seen in FIG. 2. This layer should be deposited to leave between about 0.5 to 1.5 micrometers of insulator over the epitaxial fill subsequent to planarization. One preferred material for the capping layer is tetraethylorthosilicate (TEOS) to form a silicon dioxide layer. This film is deposited at 730° C. in a LPCVD system optimally at below 1 torr, and $N_2$ is used as a carrier gas. The TEOS source is at 55° C. (11 torr) and pumping speed controls the pressure. The films are densified at between 800° to 900° C. for about 30 minutes in steam. For further information concerning this process reference may be made to the D. L. Burt et al., U.S. Pat. No. 3,934,060.

A FIG. 2 structure now is to be polished using a chemical-mechanical polishing process to remove the insulator layer 36 from above the pattern of trenches. The chemical-mechanical polishing process is varied depending upon the composition of the insulating layer 36. Where the silicon dioxide has been formed from the TEOS process the polishing may be accomplished using 6 weight percent colloidal silica with potassium hydroxide to adjust the pH to about 12. This slurry can be formed using colloidal silica, such as the trademarked silica sol composition "Syton HT-50" commercially available from Monsanto Company, St. Louis, Mo., U.S.A. This Syton HT-50 has a silica content of about 50 weight percent with the maximum particle size of 40 to 45 millimicrons. The polishing machine includes a bowl having a slurry outlet and a driven plate. Mounted on the plate by any suitable means is a soft, firm surface composed of a poromeric material, such as an artificial leather or PODELL 210 made by the Podell Inc., of Newark, Del., U.S.A. The plate is rotated by means of suitable driving means coupled through a shaft. The wafers to be polished are mounted on a plate opposite to the poromeric surface by means of suitable adhesive or other suitable method. The plate with the mounted wafers thereon is maintained against the surface with a substantial pressure applied to urge the wafers firmly against the polishing surface. The preferred pressure is between about 2 to 6 PSI. The rotation of the driven plate having the poromeric polishing material thereon produces a rotation of the plate having the wafers thereon. The surface of the wafers is continuously wetted with excess quantity of polishing slurry by flowing it through an opening in the rotating plate. A parastolic pump moves the slurry through the opening. Excess slurry is splashed from the end of the rotating plates and flows out of the excess slurry opening. The removal rates are about 4000 Angstroms/per minute. Where a silicon nitride layer is utilized as a stop layer the ratio of polishing is 10 to 1 in favor of silicon dioxide over silicon nitride.

The chemical-mechanical polishing mechanism is not fully understood. However, it is believed that the surface of the silicon dioxide is hydrolyzed by the slurry and the poromeric surface wipes off this by hydrolyzed material at the high points on the wafers until a stop layer such as $Si_3N_4$ is reached. The $Si_3N_4$ material is not polished as fast as silicon dioxide with this slurry and pH conditions. The polishing ratio is about 10 $SiO_2$ to 1 $Si_3N_4$.

The following EXAMPLE is included merely to aid in the understanding of the invention and variations may be made by one skilled in the art without departing from the spirit and scope of the invention.

EXAMPLE I

The epitaxial refills obtained and measured for the data summarized in FIG. 4 and FIG. 5 were grown at 1000° C. at near atmospheric pressure using $SiCl_4$-$H_2$ with and without HCl as indicated on the plot. The epitaxial refills were deposited in an AMC 7800 reactor manufactured by Applied Materials, Santa Clara, Calif. $B_2H_6$ was employed as a dopant. The $SiCl_4$ input was 10.2 g/min. in a $H_2$ flow of 120 lpm (liters per minute). Fill level vs. time are plotted for a number of cases, for the above conditions, with and without HCl. Spurious growth was observed for the epitaxial refills where no HCl was employed whereas no spurious growth occurred for the refills wherein 0.6 lmp HCl was employed.

The trench was filled to 1.5 micrometers from the top surface of the silicon wafer. A low temperature silicon dioxide layer of 2.0 micrometers was blanket deposited over the surface having the trench. The deposition used TEOS at 730° C. in a low pressure chemical vapor deposition system. The silicon dioxide layer was then densified by heating it in steam at 800° C. for 30 minutes.

The TEOS-deposited silicon dioxide layer was polished back to remove all of the silicon dioxide on the surface of the wafer. The result is a filled trench with the silicon dioxide capping layer. The polishing was accomplished by using a 6 weight % colloidal silica slurry which had a pH of 12. The pH was adjusted with KOH. The water to be polished was fixed to one plate. A IC-40 poromeric surface produced by Podell Inc. of Newark, Del. was mounted on a second plate. The poromeric surface was firmly urged against the wafer with a pressure of 3 psi. The poromeric surface carried plate was also driven to cause rotation which in turn produces a rotation of the plate carrying the wafer. The surface of the wafer was continuously wetted with excess quantity of polishing slurry by flowing it through a central opening in the rotating plate. The silicon dioxide layer above the trench was removed at a rate of 400 nanometers/minute.

EXAMPLE II

HCl flow was varied from 0-5 lpm in separate experiments. HCl inputs between 0 and 0.5 lpm yielded spurious growth. Marked reduction in spurious growth occurred between HCl inputs of above 0.5 lpm and 0.6 lpm where the growth was eliminated. Although spurious growth was not observed for values above 0.6 lpm the deposition rates became unsuitably low, for values greater than 1.4 lpm (0.05 μm/min) for very deep trench filling. At HCl inputs above 2.3 lpm etching rather than deposition occurred making this an unsuitable region. (Data not shown). The deposition condition at approximately 1.0-1.4 lmp of HCl appear optimum for reducing spurious growth as well as providing flat, nearly facetless refills at a suitable rate of fill. The most optimum value is between about 1.1-1.2 lpm HCl.

While the invention has been particularly shown and described with reference to the preferred embodiments thereof it will be understood by those skilled in the art that the foregoing and other changes in form and detail may be made therein without departing from the spirit and scope of the invention.

What is claimed is:

1. Method for forming a void free, deep isolation structure in a monocrystalline silicon body comprising:
   providing a substantially vertically sided pattern of trenches greater than about 3 micrometers deep having an insulating layer sidewall and monocrystalline silicon bottom;
   epitaxially growing monocrystalline semiconductor in said pattern of trenches from said monocrystalline semiconductor bottom while preventing any spurious growth on the surfaces of the silicon body during the epitaxial deposition by using a $SiCl_4$-$H_2$-HCl gaseous reaction system at about one atmosphere pressure;
   continuing the epitaxial growth until the trenches are filled up to between about 300 to 1500 nanometers from the surface of the said body;
   forming a chemical vapor deposited insulator layer on the surface of the semiconductor body and filling the remaining portion of the pattern of trenches; and
   removing the portion of the said chemical vapor deposited insulator layer above the pattern of trenches by means of a chemical-mechanical polishing technique.

2. The method of claim 1 wherein semiconductor body is monocrystalline silicon and said insulating layer sidewall is silicon nitride.

3. The method of claim 2 wherein a silicon dioxide layer is formed between said silicon nitride sidewall and said monocrystalline silicon body.

4. The method of claim 1 wherein the depth of said trenches is between about 3 to 10 micrometers.

5. The method of claim 4 wherein the width of said trenches is between about 1.0 to 300 micrometers.

6. The method of claim 1 wherein said epitaxially growing silicon is accomplished with the HCl component being between about 0.6 to 2.3 lmp.

7. The method of claim 6 wherein said growing is accomplished at a temperature between about 900° and 1100° C. With the HCl component being between about 1.0 and 1.4 lpm.

8. The method of claim 1 wherein said chemically vapor deposited insulator layer the surface of said body is silicon dioxide.

9. The method of claim 8 wherein the said silicon dioxide is deposited using the TEOS.

10. The method of claim 1 wherein said chemical-mechanical polishing uses a silica slurry with a PH of about 12.

* * * * *